United States Patent [19]
Hauenstein

[11] 4,334,184
[45] Jun. 8, 1982

[54] ELECTRONIC SENSOR ON/OFF SWITCH

[75] Inventor: Alfred Hauenstein, Munich, Fed. Rep. of Germany

[73] Assignee: Siemens Aktiengesellschaft, Berlin and Munich, Fed. Rep. of Germany

[21] Appl. No.: 152,047

[22] Filed: May 21, 1980

[30] Foreign Application Priority Data

May 31, 1979 [DE] Fed. Rep. of Germany ....... 2922309

[51] Int. Cl.³ .................... H03K 17/72; G05F 1/45
[52] U.S. Cl. .......................... 323/235; 307/252 B; 307/252 UA
[58] Field of Search ........ 307/252 B, 252 UA, 252 N, 307/305, 308; 323/235, 237, 241, 319, 320, 322

[56] References Cited

U.S. PATENT DOCUMENTS

| | | | |
|---|---|---|---|
| 3,506,852 | 4/1970 | DeHart | 307/252 UA |
| 3,780,318 | 12/1973 | Werts et al. | 307/252 UA |
| 3,882,328 | 5/1975 | Mazgy et al. | 307/252 UA |
| 4,087,697 | 5/1978 | Johnson | 307/252 B |
| 4,218,648 | 8/1980 | Sansum | 323/235 |

Primary Examiner—John Zazworsky
Attorney, Agent, or Firm—Herbert L. Lerner; Laurence A. Greenberg

[57] ABSTRACT

Electronic sensor on/off switch for a load connected to an a-c supply network includes a controlled semiconductor switch connected in series with the load, a sensor for switching the load on and off, a control circuit connected from the sensor to the switch, the switch being addressable by the control circuit in a conducting state with the load switched on by a signal holding the switch in the conducting state at the zero crossing of a current passing through the load, and in a non-conducting state with the load disconnected by a signal switching the switch into the conducting state for switching on the load at the zero crossing of an output a-c voltage at the switch, a power supply circuit connected to the control circuit, a two-terminal voltage limiting network connected in a series circuit with the switch for generating an amplitude-limited a-c voltage if the switch is conducting, an inductive converter connected to the two-terminal voltage limiting network, a terminal producing a reference potential point connected to the two-terminal voltage limiting network, a storage capacitor connected to the inductive converter for producing a supply voltage for the control circuit relative to the reference potential point, a branch connected to the series circuit of the two-terminal voltage limiting network and the switch including the storage capacitor and a rectifier, and another terminal connected between the storage capacitor and the rectifier for producing the supply voltage in the non-conducting state of the switch, the storage capacitor being charged by the output a-c voltage when the switch is in the non-conducting state.

16 Claims, 21 Drawing Figures

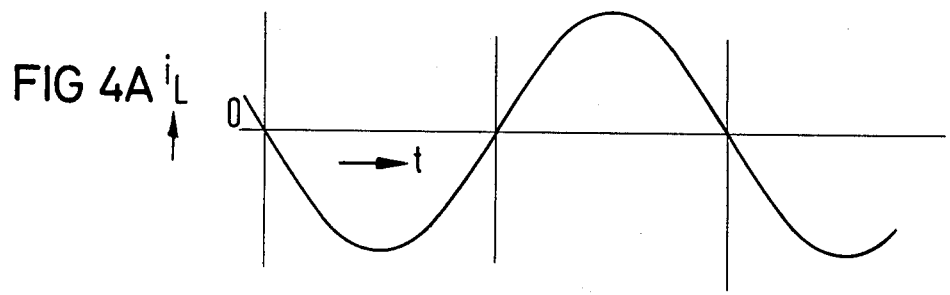
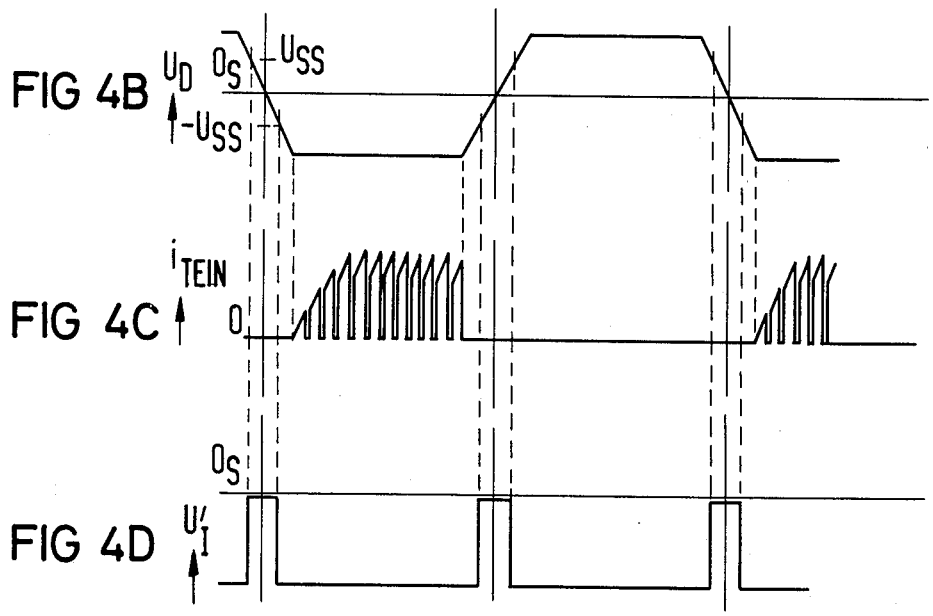

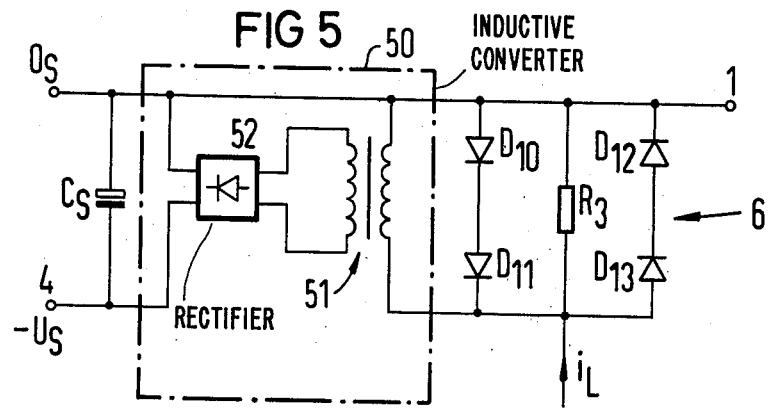
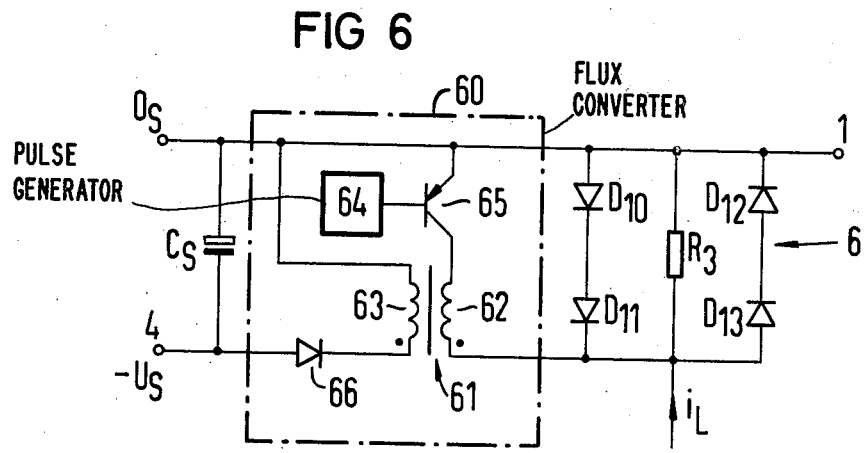
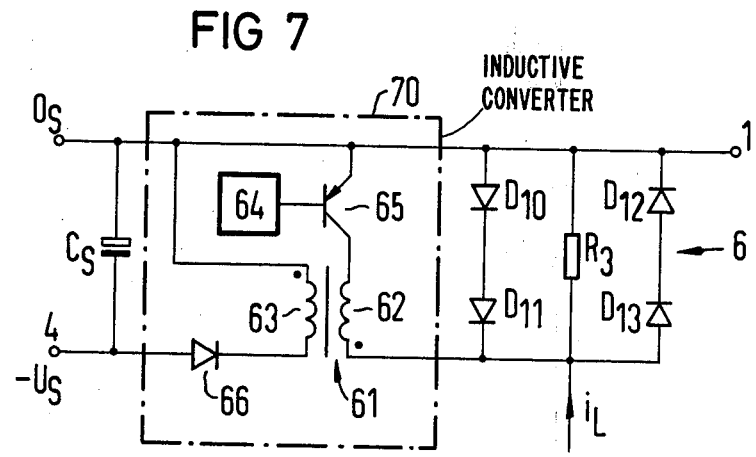

ELECTRONIC SENSOR ON/OFF SWITCH

The present invention relates to an electronic sensor on/off switch for a load which is connected to an a-c supply network, particularly in the form of a two-wire line, with a controlled semiconductor switch, particularly a triac which is connected in series with the load and can be addressed by a sensor constructed as a touch-switch for switching the load on and off.

In order to provide on/off switches of the above-mentioned type with the largest possible power being delivered to the load, the switch must not gate the phase of the a-c voltage supplied from the a-c network and of the load a-c current which flows in the on-position. In addition, this is also important for interference reasons, because otherwise expensive radio interference suppression components must be provided.

If on/off switches are connected through two-wire lines, only one pole of the a-c supply network is available at the point of installation. In these cases, the use of electronic on/off switches presents problems because in the "on" condition, the residual voltage at the control semiconductor switch is so small that it is not sufficient for supplying the electronic circuitry with an operating voltage.

It is accordingly an object of the invention to provide an electronic sensor on/off switch which overcomes the hereinaforementioned disadvantages of the heretofore-known devices of this general type, and in which the controlled semiconductor switch can be addressed in the off-position as well as in the on-position at zero crossings of the a-c voltage or at the zero crossings of the load current flowing in the on-condition, and the electronic circuitry can be supplied with the supply voltage from the a-c voltage or from the load a-c current.

With the foregoing and other objects in view, there is provided in accordance with the invention, an electronic sensor on/off switch for a load connected to an a-c supply network, such as a two-wire line, comprising a controlled semiconductor switch, such as a triac connected in series with the load, a sensor, such as a touch switch, for switching the load on and off, a control circuit connected from the sensor to the switch, the switch being addressable by the control circuit in a conducting state with the load switched on by a signal holding the switch in the conducting state at the zero crossing of a current passing through the load, and in a non-conducting state with the load disconnected by a signal switching the switch into the conducting state for switching on the load at the zero crossing of an output a-c voltage at the switch, a power supply circuit connected to the control circuit, two-terminal voltage limiting network connected in a series circuit with the switch for generating an amplitude-limited a-c voltage if the switch is conducting, an inductive converter connected to the two-terminal voltage limiting network, a terminal producing a reference potential point connected to the two-terminal voltage limiting network, a storage capacitor connected to the inductive converter for producing a supply voltage for the control circuit relative to the reference potential point, a branch connected to the series circuit of the two-terminal voltage limiting network and the switch including the storage capacitor and a rectifier, and another terminal connected between the storage capacitor and the rectifier for producing the supply voltage in the non-conducting state of the switch, the storage capacitor being charged by the output a-c voltage when the switch is in the non-conducting state.

In accordance with another feature of the invention, the two-terminal voltage limiting network comprises an ohmic resistor and two rectifiers connected in parallel to the resistor and anti-parallel to each other.

In accordance with a further feature of the invention, each rectifier is in the form of at least one series-connected diode.

In accordance with an added feature of the invention, the inductive converter is in the form of a choke converter.

In accordance with an additional feature of the invention, the choke converter comprises a pulse generator having a pulse repetition frequently being high relative to one-half the line frequency, a semiconductor switch, such as a transistor, controlled by the pulse generator, a choke coil connected in series with the control path of the semiconductor switch, the choke coil and control path of the semiconductor switch being shunted across the two-terminal voltage limiting network, and a rectifier diode having an anode connected to the supply voltage terminal and a cathode connected to the connection of the choke coil and the control path of the semiconductor switch.

In accordance with yet another feature of the invention, the inductive converter comprises a power transformer and a rectifier connected to the power transformer.

In accordance with a further feature of the invention, the inductive converter is in the form of a flux converter.

In accordance with yet an added feature of the invention, the inductive converter is in the form of a blocking transformer.

In accordance with yet an additional feature of the invention, the switch has a control electrode, the sensor is operable to produce an on-signal, and the control circuit comprises a voltage zero crossing detector for delivering a pulse-shaped output signal as a function of the zero crossings of the output a-c voltage if the switch is in the non-conducting state and the load is switched off, a logic circuit operable by receiving the on-signal from the sensor and the pulse-shaped output signal for feeding the pulse-shaped output signal to the control electrode, and a current zero crossing detector connected to the two-terminal voltage limiting network for transforming voltage at the two-terminal voltage limiting network into a pulse-shaped output signal, the voltage zero crossing detector being disconnected from the control electrode and the pulse-shaped output signal of the current zero crossing detector being connected to the control electrode by the logic circuit when the switch is in the conducting state.

In accordance with still another feature of the invention, the voltage zero crossing detector comprises a first transistor having an emitter connected to the output a-c voltage reference potential point terminal, a first working resistor connected from the collector of the first transistor to the supply voltage terminal, a voltage divider being connected to the supply voltage terminal and having a tap connected to the base of the first transistor, a second transistor having an emitter connected to the tap of the voltage divider, a collector connected to the collector of the first transistor, and a base connected to the output a-c voltage reference potential point terminal, a third transistor having an emitter connected to the output a-c voltage reference potential point terminal, a second working resistor connected from the collector of the third transistor to the supply voltage terminal, and a base of the third transistor connected to the collectors of the first and second transistors and the first working resistor, the first and second transistors being switched into conduction at given negative and positive values in the region of the zero crossing of the output a-c voltage by the voltage divider, and an output connected to the collector of the third transistor and the second working resistor for producing the pulse-shaped output signal between the collector of the third transistor and the output a-c voltage reference potential point terminal.

In accordance with still a further feature of the invention, the current zero crossing detector comprises a first transistor, at least one diode connected against flow direction of the base-emitter path of the first transistor from the base of the first transistor to the two-terminal voltage limiting network, a first resistor connected from the base of the first transistor to the supply voltage terminal, the emitter of the first transistor being connected to the reference potential point terminal, a second resistor connected from the collector of the first transistor to the supply voltage terminal, a second transistor having a base connected to the collector of the first transistor and an emitter connected to the reference potential point terminal, a second resistor connected from the base of the second transistor to the supply voltage terminal, a third resistor connected from the collector of the second transistor to the supply voltage terminal, a third transistor having an emitter connected to the reference potential point terminal and a collector connected to the collector of the second transistor and the third resistor, a fourth resistor connected from the base of the third transistor to the two-terminal voltage limiting network, a fourth transistor having a base connected to the collector of the third transistor and an emitter connected to the reference potential point terminal, a fifth resistor connected from the collector of the fourth transistor to the supply voltage terminal, and an output connected to the collector of the fourth transistor producing the pulse-shaped output signal between the output and the reference potential point terminal.

In accordance with still an added feature of the invention, there is provided a monostable multivibrator connected between the current zero crossing detector and the logic circuit for adjusting a given pulse width of the pulse-shaped output signal.

In accordance with still an additional feature of the invention, the monostable multivibrator and the voltage zero crossing detector each include an output, and the logic circuit comprises a flip-flop having a setting input connected to the output of the monostable multivibrator, a resetting input and a complimentary output, an inverter connected from the resetting input to the output of the voltage zero crossing detector, a first AND gate having one input connected to the complimentary output of the flip-flop, and another input connected to the output of the voltage zero crossing detector, an OR gate having one input connected to an output of the first AND gate and another input connected to the output of the monstable multivibrator, and a second AND gate having one input connected to the output of the OR gate, another input connected to the sensor and an output connected to the control electrode of the switch.

In accordance with again another feature of the invention, there is provided a pre-amplifier connected to the sensor, a time delay stage connected to the pre-amplifier, a second flip-flop having a control input connected to the time delay stage and an output connected to the other input of the second AND gate.

In accordance with again a further feature of the invention, the logic circuit further comprises another monostable multivibrator having an input connected to the output of the second flip-flop and an output, another OR gate having an input connected to the output of the other monostable multivibrator, another input connected to the output of the second AND gate, and an output connected to the control electrode.

In accordance with a concomitant feature of the invention, the switch has a control electrode, the sensor is operable to produce an on-signal, and the control circuit comprises a voltage zero crossing detector for delivering a pulse-shaped output signal as a function of the zero crossings of the output a-c voltage if the switch is in the non-conducting state and the load is switched off, a logic circuit operable by receiving the on-signal from the sensor and the pulse-shaped output signal for feeding the pulse-shaped output signal to the control electrode, the logic circuit comprising an AND gate having an input connected to the voltage zero crossing detector, and another input connected to the sensor, an inverter having an input connected to the sensor and an output, a flip-flop having a setting input connected to the output of the AND gate, a resetting input connected to the output of the inverter, and an output being controlled by the setting input and connected to the control electrode.

Other features which are considered as characteristic for the invention are set forth in the appended claims.

Although the invention is illustrated and described herein as embodied in an electronic sensor on/off switch, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIG. 1 is a schematic and block circuit diagram of a first embodiment of an electronic sensor on/off switch according to the invention;

FIGS. 2A to 2H, respectively, are signal diagrams for explaining the operation of the electronic sensor on/off switch according to FIG. 1;

FIG. 3 is a schematic circuit diagram of an embodiment of a supply voltage circuit for the electronic sensor on/off switch according to FIG. 1;

FIGS. 4A to 4D, respectively, are signal diagrams for explaining the operation of the supply voltage circuit according to FIG. 3 and the operation of a current zero crossing detector according to FIG. 10;

FIGS. 5 to 7 are respective schematic circuit diagrams of embodiments of an inductive transformer for the power supply circuit;

Figure 1:
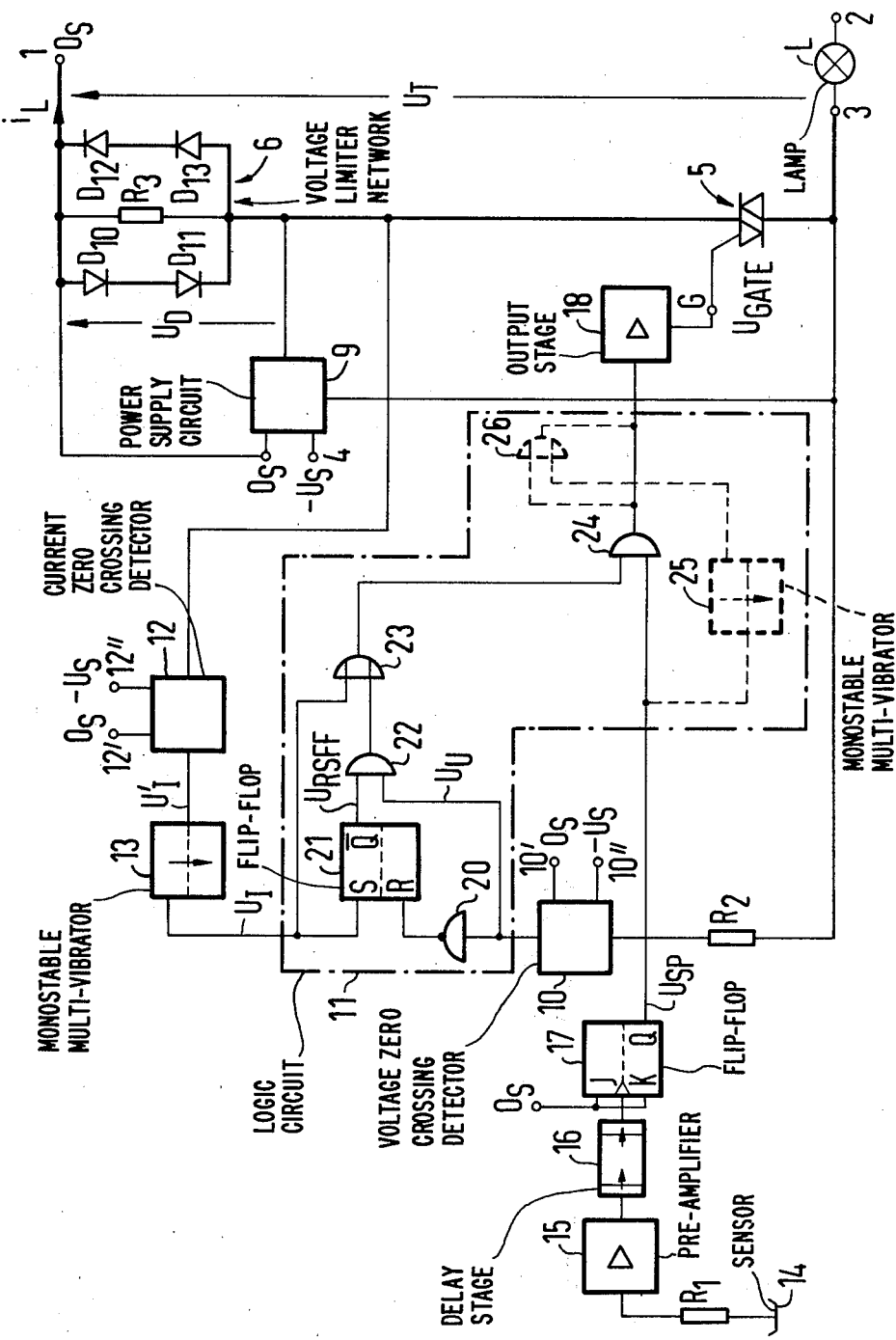

Referring now to the figures of the drawing and first particularly to the block diagram according to FIG. 1 as well as to the signal diagrams according to FIGS. 2A and 2H, a first embodiment of an electronic sensor on/off switch according to the invention will be described hereinbelow.

According to the block diagram of FIG. 1, there is seen an a-c voltage supply network in the form of a two-wire line connected to terminals 1 and 2. Connected in series with this a-c supply network are a lamp L forming a load, a controlled semiconductor switch in the form of a triac 5, and a two-terminal voltage limiter network 6. This two-terminal voltage limiter network 6 is formed by a resistor $R_3$ as well as by diode branches which are connected in parallel to this resistor $R_3$ and anti-parallel to each other. Each diode branch has two series-connected diodes $D_{10}$, $D_{11}$ and $D_{12}$ and $D_{13}$, respectively. If the triac 5 is cut off or non-conducting, an a-c voltage $U_T$ drops between the terminal 1 and a terminal 3 at the series circuit comprising the two-terminal voltage limiter network 6 and the triac 5, while with triac 5 conducting, a load current $i_L$ flows through the series circuit comprising the two-terminal voltage limiter network 6, the triac 5 and the lamp L. As will be explained further, with the use of the diagrams according to FIGS. 2A to 2H, the voltage $U_T$ is referred to a reference potential $O_S$ at the terminal 1, so that the terminal 3 can be designated as the output of the electronic sensor on/off switch. The a-c voltage $U_T$ is therefore called the output a-c voltage.

As already explained, it is important for the operation of the electronic sensor on/off switch for the switching processes to be referred to the zero crossing of the voltage $U_T$ and the current $i_L$, respectively. For this purpose, a voltage zero crossing detector 10 as well as a current zero crossing detector 12 are provided in the circuit according to FIG. 1. The voltage zero crossing detector 10 is coupled here through a resistor $R_2$ to the output terminal 3, while the current zero crossing detector 12 is coupled to the two-terminal voltage limiter network 6. In order to ensure power supply in the switched-off as well as in the switched-on condition, a power supply circuit 9 which will be described in detail hereinbelow, is provided according to the invention and is likewise coupled on the input side thereof to the two-terminal voltage limiter network 6. This power supply circuit 9 furnishes a supply voltage $-U_S$ at an output terminal 4 in a manner which will be described in detail further on. A further output terminal of the power supply circuit 9 is connected to the terminal 1 so that at this output terminal of the power supply circuit 9, the reference potential $O_S$ is available. The reference potential $O_S$ is fed to a terminal 10' of the voltage zero crossing detector 10 and to a terminal 12' of the current zero crossing detector 12. The supply voltage $-U_S$ is fed to a terminal 10'' to the voltage zero crossing detector 10 and to a terminal 12'' of the current zero crossing detector 12.

For addressing the triac 5 at its gate G with a gate voltage $U_{GATE}$, the output signals of the voltage zero crossing detector 10, of the current zero crossing detector 12 as well as a switching signal from a sensor 14 are interlinked through a logic circuit 11 and are fed to the gate G of the triac 5 through an output stage 18 formed by an amplifier. The current zero crossing detector 12 is followed by a monostable multi-vibrator 13 by way of which a predetermined pulse width for the pulses addressing the gate G of the triac 5 can be adjusted. The voltage zero crossing detector 10, current zero crossing detector 12 and logic circuit 11 together form a control circuit for addressing the switch 5.

The switching signals of the sensor 14 are fed through a resistor $R_1$, a pre-amplifier 15 and a time delay stage 16 to an on and off JK-flip-flop 17. An output signal of the flip-flop 17 is fed at an output Q to the logic circuit 11. The time delay stage 16 serves to eliminate switching disturbances and has a delay time of, for instance, about 0.06 seconds.

The logic circuit 11 contains a flip-flop 21 which is addressed at a setting input S by the output signal $U_I$ of the monostable multivibrator 13. The flip-flop 21 is also addressed at a resetting input R through an inverter 20 by the output signal $U_U$ of the voltage zero crossing detector 10. An AND gate 22 is addressed at one input by an output signal $U_{RSFF}$ from a complementary output $\overline{Q}$ of the flip-flop 21, and at a further input by the output signal $U_U$ of the voltage zero crossing detector 10. The output of the AND gate 22 is brought to an input of an OR gate 23, which is addressed at a further input by the output signal $U_I$ of the monostable multivibrator 13. The output of the OR gate 23 is brought to the input of a further AND gate 24 which has a second input connected to the output Q of the flip-flop 17. The output of the AND gate 24 is coupled through the output stage 18 constructed as an amplifier, to the gate G of the control electrode of the triac 5.

The operation of the above-explained electronic sensor on/off switch is as follows: It will initially be assumed that the sensor 14 has not yet given an on-signal to the circuit. According to FIG. 2C, the flip-flop 17 is then in a switching state, in which a signal $U_{SP}$ with a low level is delivered at its output Q. The AND gate 24 in the logic circuit 11 is therefore cut off so that a gate voltage $U_{GATE}$ at the reference potential $O_S$ is present at the gate G of the triac 5, according to FIG. 2D. The triac 5 is therefore cut off. Therefore, the output a-c voltage $U_T$ drops between the terminals 1 and 3, according to FIG. 2A.

Figure 2:
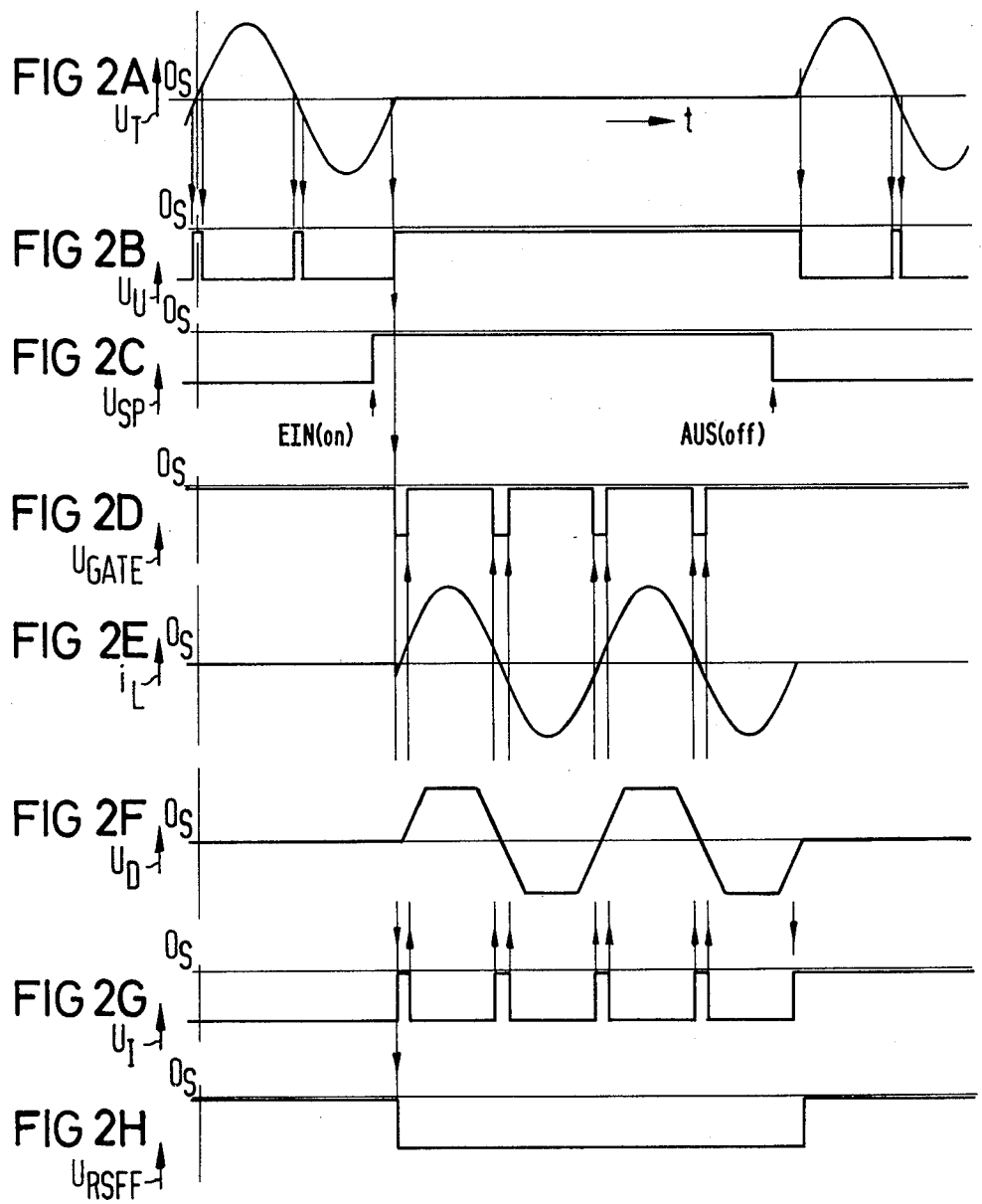

The voltage zero crossing detector 10 generates a pulse-shaped output signal $U_U$ at the zero crossings of the voltage $U_T$, according to FIG. 2B, which jumps at the zero crossings from a low level to the reference potential level $O_S$. According to FIG. 2E, the load current $i_L$ is equal to zero, so that also a voltage $U_D$ is present at the two-terminal voltage limiter network 6 at the reference level $O_S$, according to FIG. 2F. Since the output voltage $U'_I$ of the current zero crossing detector 12 is therefore also at a low level, the monostable multivibrator 13 receives no addressing signal, so that its output signal and therefore the output signal $U_I$ of the monostable multi-vibrator 13 is at low level according to FIG. 2G. The flip-flop 21 is reset by the pulse-shaped output signal $U_U$ of the voltage zero crossing detector 10 which is inverted by the inverter 20, so that at the output $\overline{Q}$ of the flip-flop 21 a signal URSFF at a high level (reference potential level $O_S$) is present according to FIG. 2H.

The AND gate 22 is therefore made operative so that it transmits the pulse-shaped output signal $U_U$ of the voltage zero crossing detector 10 to the OR gate 23 which in turn transmits the signal to the AND gate 24. Since, however, the signal $U_{SP}$ is at a low level at the output Q of the flip-flop 17 according to FIG. 2C, the AND gate 24 remains cut off so that the pulse-shaped output signal $U_U$ cannot be transmitted to the gate G of the triac 5.

It will now be assumed that an on-signal is given to the circuit by the sensor 14 at a point in time which is designated in FIG. 2C by EIN ("on"). This one on-signal is transferred to the flip-flop 17 so that the signal $U_{SP}$ at its output Q jumps to a high level (reference potential level $O_S$). As can be seen from a comparison of FIGS. 2A and 2C, the switching-on instant can be at a time different from the zero crossing of the voltage $U_T$ shown in FIG. 2A. Through the output signal $U_{SP}$ of the flip-flop 17 which is now at a high level, the AND gate 24 is activated. At the next zero crossing of the voltage $U_T$ following the switching-on instant, the output signal $U_U$ of the voltage zero crossing detector 10 jumps to a high level (reference potential level $O_S$) which is now transferred or transmitted through the activated AND gate 24 to the gate G of the triac 5. In this way, the triac 5 is switched into conduction. According to FIG. 2E, the load current $i_L$ then flows in the circuit between the terminals 1 and 2 according to FIG. 1.

Since the load current $i_L$ now flows, the voltage $U_D$ drops at the two-terminal voltage limiter network 6. From this voltage $U_D$, the current zero crossing detector 12 and the following monostable multi-vibrator 13 generate a pulse-shaped signal $U_I$, according to FIG. 2G. This signal is transmitted through the OR gate 23 and the AND gate 24 which is made operative by the on-signal $U_{SP}$ according to FIG. 2C. The signal is then transmitted to the output stage 18, and to the gate G of the triac 5. At the same time the flip-flop 21 is set by the signal $U_I$ fed to its setting input, so that the signal $U_{RSFF}$ at its output $\overline{Q}$ falls to a low level according to FIG. 2H and, therefore, the AND gate 22 is cut off.

Since, with the load current $i_L$ flowing, the voltage $U_T$ becomes zero according to FIG. 2A, the voltage zero crossing detector 10 furnishes an output signal $U_U$ which is constant at a high level in the switched-on state of the sensor on/off switch according to FIG. 2B. However, this signal is not transmitted because the AND gate 22 is cut off.

If the sensor on/off switch is switched off again with a zero signal at a later time designated in FIG. 2C with AUS ("off") through renewed operation of the sensor 14, the signal conditions according to FIGS. 2A to 2H which have been explained already herein-above for the off condition occur again.

If the load L according to FIG. 1 is a fluorescent lamp, a compensation must be made until such a fluorescent lamp is completely fired, since the full load current $i_L$ cannot flow all the time to the firing instant. According to a variant, shown in FIG. 1 by dotted lines, an additional possibility is provided, for switching-on such fluorescent lamps, in the logic circuit 11, and for addressing the triac 5 for a predetermined initial period of time of, for instance, 1 second after switching-on with a gate voltage $U_{GATE}$. For this purpose, there is provided a monostable multi-vibrator 25 having an output connected to one input of an OR gate 26 and an input connected to the output Q of the flip-flop 17. A further input of this OR gate 26 is connected to the output of the AND gate 24. The output of the OR gate 26 is coupled to the gate G of the triac 5 through the output state 18. If an on-signal is delivered by the sensor 14 through the output Q of the flip-flop 17, then the monostable multi-vibrator 25 delivers a corresponding signal which is fed continuously to the gate G of the triac 5 through the OR gate 26 and the output state 18. This signal is delivered in accordance with its time constant which is chosen for the predetermined initial time period, at its output. The triac 5 is therefore continuously kept in its conducting state for the predetermined initial time period until the fluorescent lamp forming the load L is fully ignited.

Figure 3:
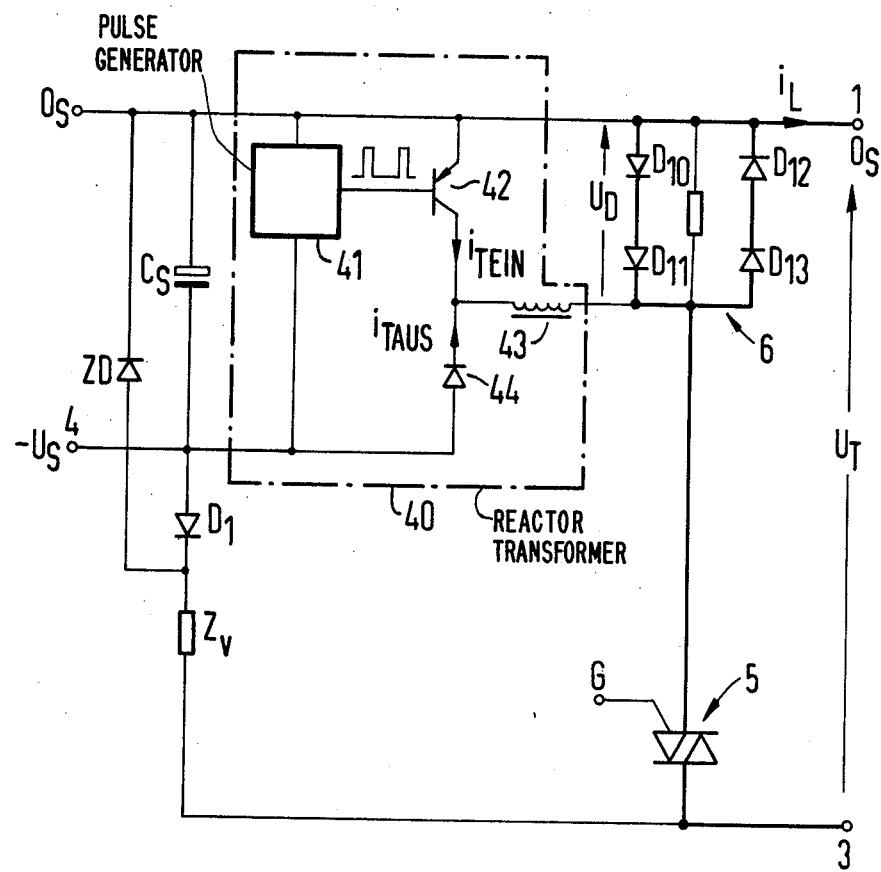

The following is a description of the power supply for the electronic circuitry of the electronic sensor on/off switch according to FIG. 1 in accordance with the invention, referring to FIG. 3 in which like elements as in FIG. 1 are provided with the same reference symbols.

It will first be assumed that the electronic sensor on/off switch is switched off, so that the output voltage $U_T$ is present between the terminals 1 and 3. For this case, in the power supply circuit 9 there is provided a branch between the terminals 1 and 3 which is formed by a series circuit comprising a storage capacitor $C_S$, a rectifier in the form of a diode $D_1$ and a series resistor $Z_V$. The series circuit comprising the storage capacitor $C_S$ and the diode $D_1$ is shunted by a voltage limiting Zener diode ZD. If the triac 5 is cut off, the storage capacitor $C_S$ is charged-up by the output voltage $U_T$, so that at a junction point between the storage capacitor $C_S$ and the diode $D_1$, forming the terminal 4, the supply voltage $-U_S$ can be taken off relative to the terminal 1 forming the reference potential point $O_S$.

The series resistor $Z_V$ serves for limiting the current and can be formed, for instance, by a purely ohmic resistor or by an RC member.

If the triac 5 is switched into conduction in line with the explanations regarding the circuit according to FIG. 1, a load current $i_L$ flows, whereby the voltage $U_D$ drops at the two-terminal voltage limiter network 6. According to one embodiment of the invention, an inductive transformer in the form of a reactor transformer 40 is coupled to the two-terminal voltage limiter network 6. This reactor transformer (or converter) contains a pulse generator 41 which is connected between the terminals 1 and 4 to the supply voltage $-U_S$. The pulse generator 41 may be, for instance, a conventional known astable multi-vibrator which furnishes a pulse train with predetermined pulse repetition frequency. The base of a switching transistor 42 is completed to the output of the pulse generator 41, its emitter is connected to the terminal 1 (reference potential point $O_S$) and its collector is connected on one hand through a choke 43 to the two-terminal voltage limiter network 6 and on the other hand through a rectifier diode 44 to the terminal 4 carrying the supply voltage $-U_S$. The anode of the rectifier diode 44 is connected to the terminal 4, and its cathode is connected to the collector of the switching transistor 42.

The operation of the supply voltage power supply 9 described above will be further described hereinbelow with the aid of the signal diagrams of FIGS. 4A to 4C for the switched-on condition of the sensor on/off switch with the load current $i_L$ flowing. In FIG. 4A, the wave-shape of the load current $i_L$ is shown as a function of time. With increasing current during the negative half-wave of the load current $i_L$, the voltage porportional to the current initially drops at the resistor $R_3$ according to the diagram of FIG. 4B, so that the voltage $U_D$ increases with the load current. If the voltage drop at the resistor $R_3$ reaches the sum of the threshold voltages of the series circuit of the diodes $D_{10}$ and $D_{11}$ which are shunted across the resistor $R_3$, then these diodes coduct fully, so that the voltage $U_D$ can no longer increase with the load current $i_L$ and, therefore remains constant according to the diagram of FIG. 4B.

The switching transistor 42 is alternatingly switched into conduction and cut-off or non-conduction at its base by the pulse-shaped output signal of the pulse generator 41. As long as the voltage $U_D$ (FIG. 4B) has not yet reached the sum of the threshold voltages of the diode series circuits, no current can flow yet through the transistor 42 in the conducting state thereof, since the diode series circuits do not yet conduct. If, however, the voltage $U_D$ has reached the sum of the threshold voltages of the series circuit of two diodes, current can flow with the transistor 42 conducting, in the circuit comprising this transistor 42, the choke 43 and the series circuit of two diodes. During the negative half-wave of the load current $i_L$, the junction point between the choke 43 and the two-terminal voltage limiter network 6 is negative with respect to the terminal 1 (reference potential point $O_S$). With the transistor 42 switched into conduction, current can flow through its emitter-collector path, the choke 43 and the series circuit of the diodes $D_{10}$ and $D_{11}$, whereby magnetic energy is stored in the choke. This current is designated in FIG. 3 and in the diagram according to FIG. 4C by $i_{TEIN}$. It is evident from FIG. 4C that this current $i_{TEIN}$ has a pulse-shaped waveform according to the on and off times of the switching transistor 42, whereby a sawtooth-like peak is superimposed during the on-times of the switching transistor 42 in accordance with the energy already stored in the choke 43. Due to the energy stored in the choke 43, a current flows during the off-times of the switching transistor 42 in the circuit comprising the choke 43, the diodes $D_{10}$ and $D_{11}$, the storage capacitor $C_S$ and the rectifier diode 44; this current is designated in FIG. 3 by $i_{TAUS}$. The current is supplied by the energy stored in the choke 43, and charges the storage capacitor $C_S$ so that in the oncondition of the sensor on/off switch, the supply voltage $-U_S$ can be taken off at the terminal 4 from the charging voltage of the storage capacitor $C_S$.

During the positive half-wave of the load current $i_L$ according to FIG. 4A, the polarity of the voltage $U_D$ is reversed according to the diagram of FIG. 4B. Since now the junction point between the choke 43 and the two-terminal voltage limiter network 6 becomes positive with respect to the terminal 1 (reference potential point $O_S$), no current can flow through the switching transistor 42, i.e. the current $i_{TEIN}$ is equal to zero according to FIG. 4C.

According to the choke converter described above in the power supply circuit according to FIG. 3, other inductive converters can also be used in accordance with further embodiments of the invention.

Such embodiments are shown in FIGS. 5 to 7 in which like elements as in FIGS. 1 and 3 are provided with the same reference symbols FIG. 5 shows an embodiment, in which the inductive converter 50 with a transformer 51 constructed for line frequency is coupled to the two-terminal voltage limiter network 6; a rectifier 52 is connected to the secondary winding of this transformer 51 which is not designated specifically. The output signal of the rectifier 52 charges the storage capacitor $C_S$ to generate the supply voltage $-U_S$.

FIG. 6 shows an embodiment with an inductive converter connected to the two-terminal voltage limiter network 6 in the form of a flux converter 60. This flux converter contains a transformer 61 with a primary winding 62 and a secondary winding 63; the winding direction of these two windings being indicated by dots. The switching transistor 65 which is addressed (like the switching transistor 42 according to FIG. 3) by a pulse generator 64, is connected into the circuit of the primary winding 62. A rectifier diode 66 is connected into the circuit of the secondary winding 63. The storage capacitor $C_S$ is charged by the rectifier diode 66 to generate the supply voltage $-U_S$.

FIG. 7 shows an embodiment with an inductive converter 70 which has the same components as the flux converter according to FIG. 6. and is connected to the two-terminal voltage limiter network 6 in the form of a blocking transformer. In this blocking transformer, however, the winding direction of the secondary winding 63 of the transformer 61 is in the opposite sense of the winding direction of the secondary winding 63 of FIG. 6, as shown by the dots in FIG. 7.

Since the flux transformers and the blocking transformer of the type described above are conventionally known circuits, their operation will not be discussed in detail herein.

Figure 8:
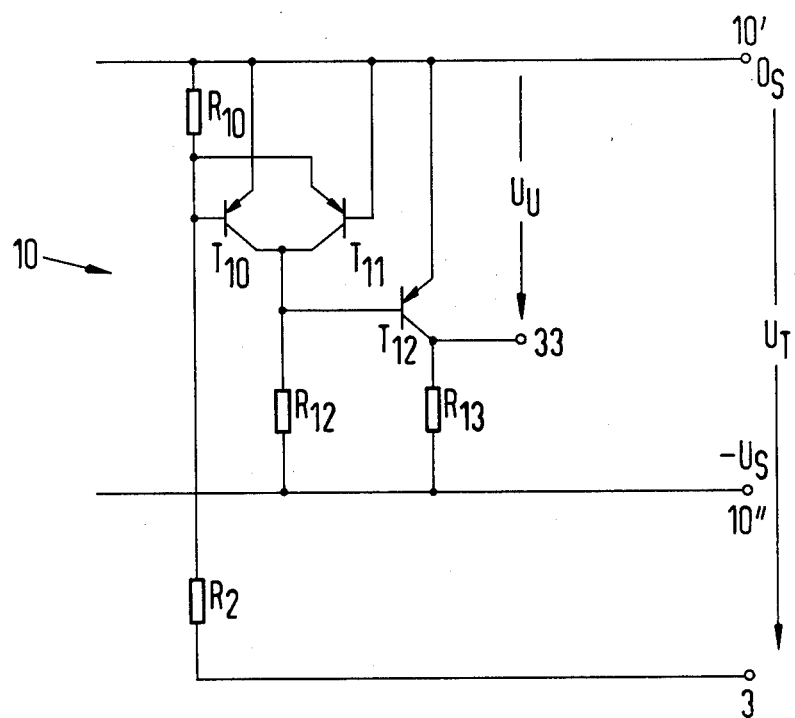
FIG. 8 is a schematic circuit diagram of an embodiment of a voltage zero crossing detector for the electronic sensor on/off switch according to the invention.

An embodiment of the voltage zero detector 10 of FIG. 1 will be described hereinbelow, referring to FIG. 8.

The output a-c voltage $U_T$, already explained in connection with FIGS. 1 and 2A to 2H, is present between the terminals 10' and 3 of this voltage zero crossing detector 10. The supply voltage $-U_S$ is fed to the terminal 10''. The voltage zero crossing detector contains two transistors $T_{10}$ and $T_{11}$, the collectors of which are tied together directly and are connected through a working resistor $R_{12}$ to the supply voltage $-U_S$. The emitter of the transistor $T_{10}$ and the base of the transistor $T_{11}$ are directly connected to the terminal 10' which leads to the reference potential $O_S$. The base of the transistor $T_{10}$ and the emitter of the transistor $T_{11}$ are connected to the tap of a voltage divider which is formed by a resistor $R_{10}$ and the resistor $R_2$, which was already mentioned in connection with FIG. 1. This voltage divider is connected between the terminal 10' and the output terminal 3.

An output transistor $T_{12}$ is connected with its base to the junction point of the collectors of the transistors $T_{10}$ and $T_{11}$ and the working resistor $R_{12}$. The emitter of the transistor $T_{12}$ is connected directly to the terminal 10' carrying the reference potential $O_S$, while its collector is connected through a working resistor $R_{13}$ to the terminal 10'' carrying the supply voltage $-U_S$. The junction point of the collector of the transistor $T_{12}$ and the working resistor $P_{13}$ forms an output 33 of the voltage zero crossing detector; the pulse-shaped output signal $U_U$ of the voltage zero crossing detector 10 can be taken off between the terminal 10' and this output 33.

The operation of this embodiment of the voltage zero crossing detector will be explained with reference to the diagram according to FIG. 9 which shows in the upper part thereof the sinusoidal output a-c voltage $U_T$ at the output terminal 3, referred to the reference potential $O_S$ at the terminal 10', as a function of time. The lower part of FIG. 9 shows the pulse-shaped output signal $U_U$ as a function of time.

It will first be assumed that the output voltage $U_T$ is larger during its negative half-wave than a threshold $-U_{SS}$. For these values of the output voltage $U_T$, the transistor $T_{10}$ is switched into conduction fully, so that its collector is connected practically at the reference potential $O_S$ to the terminal 10', while the transistor $T_{11}$ is cut off because its emitter is at the same negative potential as the base of the transistor $T_{10}$. Since the base of the transistor $T_{12}$ is practically at the reference potential $O_S$ at the terminal 10' because of the fully conducting transistor $T_{10}$, the transistor $T_{12}$ is cut off so that practically the entire supply voltage $-U_S$ drops at it. Thus, the output signal $U_U$ is at a negative (low) level according to the lower diagram of FIG. 9.

Figure 9:
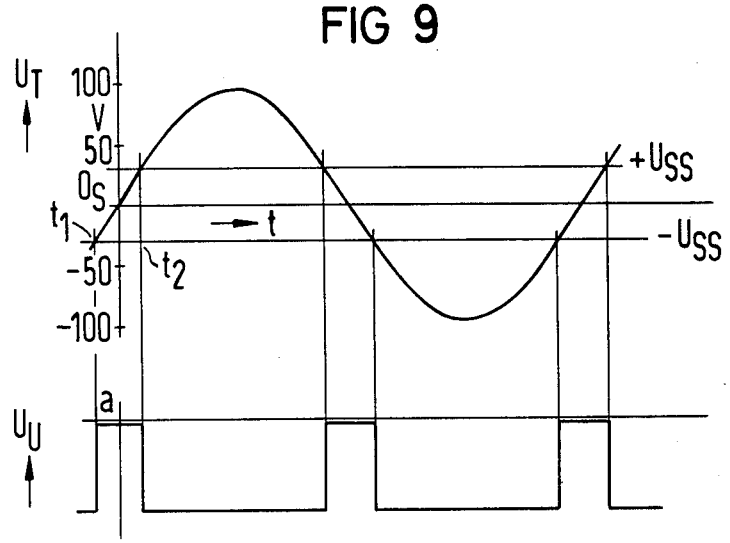
FIG. 9 is a group of signal diagrams for explaining the operation of the voltage zero crossing detector according to FIG. 8.
Figure 10:
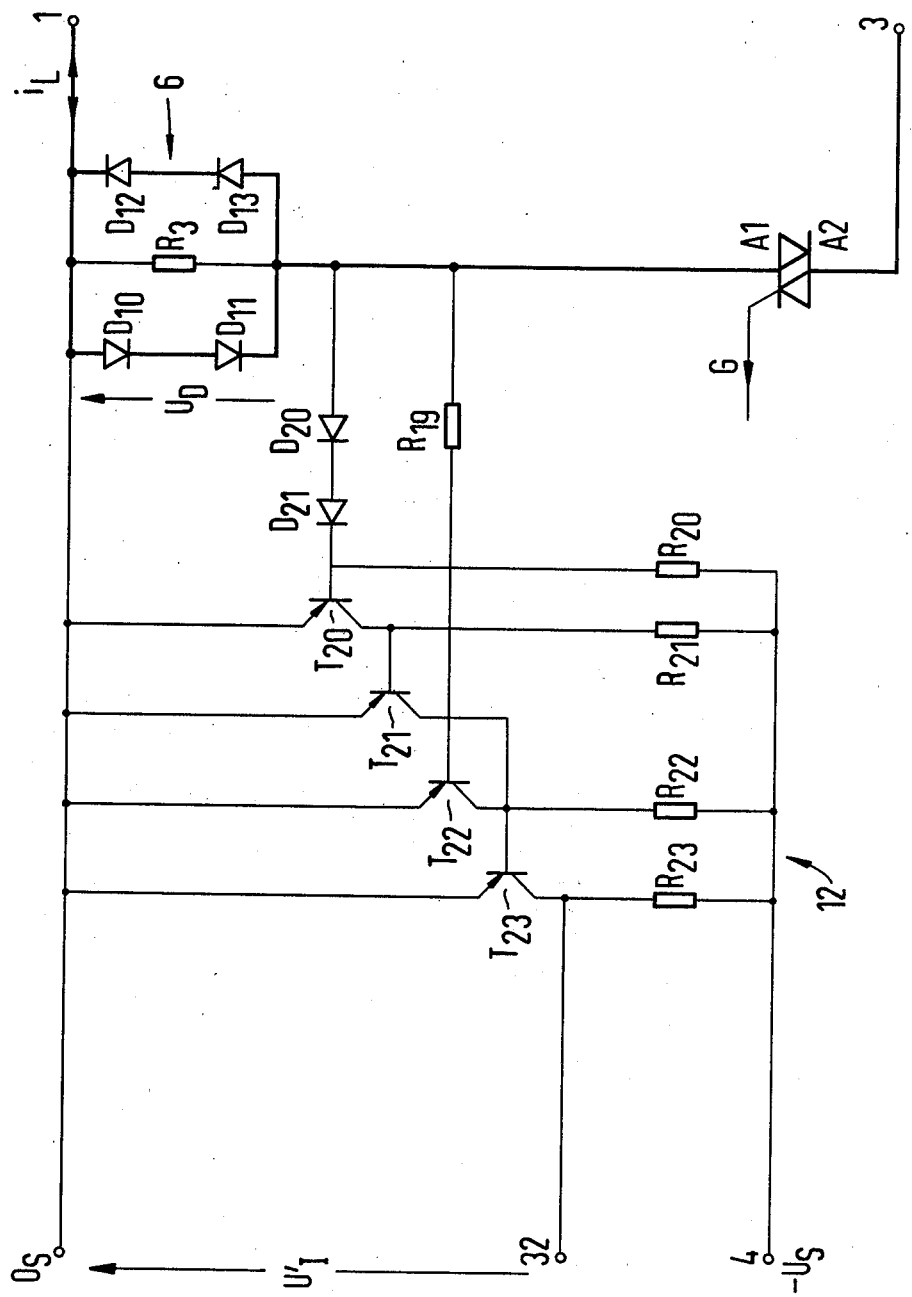
FIG. 10 is a schematic circuit of an embodiment of a current zero crossing detector for the electronic and block sensor on/off switch according to the invention.

If now according to the upper diagram of FIG. 9, the output voltage $U_T$ reaches the negative threshold value $-U_{SS}$ at a time $t_1$ during its negative half-wave, the transistor $T_{10}$ is cut off and the transistor $T_{11}$ also still remains cut off because its emitter is still at a more negative potential than the reference potential $O_S$ at the terminal 10'. The transistor $T_{12}$ can now draw current through its emitter-base path and the resistor $R_{12}$ so that it is fully switched into conduction. Its collector potential therefore becomes equal to the reference potential $O_S$ at the terminal 10', so that the output signal $U_U$ jumps to the reference potential point $O_S$ according to the lower diagram in FIG. 4.

If the voltage $U_T$ reaches a positive threshold value $+U_{SS}$ during its positive half-wave at a time $t_2$, then the emitter of the transistor $T_{11}$ becomes more positive than the base connected to reference potential $O_S$ at the terminal 10', so that the transistor $T_{11}$ is switched into conduction. The transistor $T_{10}$ remains cut off because its base is at a more positive potential than its emitter. Because the transistor $T_{11}$ conducts, the base of the transistor $T_{12}$ is now pulled again to reference potential $O_S$, so that this transistor is cut off again and the output voltage $U_U$ again jumps to the negative (low) level.

The process is repeated accordingly at all zero crossings of the output voltage $U_T$.

An embodiment of the current zero crossing detector 12 of FIG. 1 will now be described hereinbelow with reference to FIGS. 4A to 4D and 10. To explain the operation of this current zero crossing detector 12, the load circuit with the triac 5 and the two-terminal voltage limiter network 6 are shown once more in FIG. 10.

The current zero crossing detector 12 is connected across the series circuit of two diodes $D_{20}$ and $D_{21}$, as well as across a resistor $R_{19}$ at the two-terminal voltage limiting network 6. The diodes $D_{20}$ and $D_{21}$ are connected to the base of a transistor $T_{20}$; the base of this transistor being further connected through resistor $R_{20}$ to the supply voltage $-U_S$ (terminal 4). The emitter of this transistor $T_{20}$ is tied directly to the reference potential point $O_S$ (terminal 1), while its collector is connected through a resistor $R_{21}$ to the supply voltage $-U_S$ (terminal 4). The transistor $T_{20}$ is followed by a transistor $T_{21}$ which is connected with its base to the junction point of the collector of the transistor $T_{20}$ and the resistor $R_{21}$, and is connected with its emitter directly to the reference potential $O_S$ (terminal 1), and with its collector through a resistor $R_{22}$ to the supply voltage $-U_S$ (terminal 4). The resistor $R_{19}$ is brought to the base of a transistor $T_{22}$, the emitter of which is connected to reference potential $O_S$ (terminal 1) and the collector of which is connected to the junction point of the collector of the transistor $T_{21}$ and the resistor $R_{22}$. The transistor $T_{22}$ is followed by a transistor $T_{23}$, the base of which is connected to the junction point of the collector of the transistor $T_{21}$ and the resistor $R_{22}$, the emitter of which is connected to reference potential $O_S$ (terminal 1), and the collector of which is connected through a resistor $R_{23}$ to the supply voltage $-U_S$ (terminal 4). At an output 32 of the current zero crossing detector 12, the output signal $U'_I$ can be taken off with respect to the terminal 1 (reference potential $O_S$).

The operation of the current zero crossing detector described above, will now be described in conjunction with the signal diagram according to FIGS. 4A to 4D. It will first be assumed that the voltage $U_D$ according to FIG. 4B has its maximum positive value. This positive voltage is transmitted through the diodes $D_{20}$ and $D_{21}$ to the base of the transistor $T_{20}$ and through the resistor $R_{19}$ to the base of the transistor $T_{22}$. Therefore these transistors are cut off. With the transistor $T_{20}$ cut off, the transistor $T_{21}$ can draw base current through its emitter-base path and a transistor $R_{21}$, so that it is switched into the fully conducting state. Thus, the base of the transistor $T_{23}$ is practically at reference potential $O_S$, so that this transistor is cut off. Therefore, practically the entire supply voltage $-U_S$ drops at the emitter-collector path of the transistor $T_{23}$, so that the output 32 is practically at the supply voltage $-U_S$. The output signal $U'_I$ is therefore, according to FIG. 4D, at low level. Now, the falling flank of the voltage $U_D$ according to FIG. 4B with which this voltage falls at the zero crossing of the load current $i_L$ from its maximum positive value to its maximum negative value will be considered. In the still positive region, the voltage $U_D$ according to FIG. 4B reaches a threshold $+U_{SS}$ which is no longer sufficient to keep the transistor $T_{20}$ in the cut-off condition through the diodes $D_{20}$ and $D_{21}$. This positive threshold value $+U_{SS}$ is defined by the sum of the threshold voltages of the diodes $D_{20}$ and $D_{21}$. Now, the transistor $T_{20}$ can draw base current through its emitter-base path and the resistor $R_{20}$, so that it is fully switched into conduction. However, since the voltage $U_D$ still remains positive, the transistor $T_{22}$ remains cut off. With the transistor $T_{20}$ in the conducting state, the transistor $T_{21}$ is cut off since its base is practically at reference potential $O_S$ by way of the emitter-collector path of the transistor $T_{20}$. Since the transistor $T_{22}$ is also still cut off, the transistor $T_{23}$ can draw current through its emitter-base path and the resistor $R_{22}$. In this way the output signal $U'_I$ according to FIG. 4D jumps practically to the reference potential $O_S$.

If the voltage $U_D$ reaches a negative threshold $-U_{SS}$, which is determined by the resistor $R_{19}$, then the transistor $T_{22}$ received base current so that it is switched into conduction. Therefore, the transistor $T_{23}$ is cut off again since its base is now at reference potential $O_S$ by way of the emitter-collector path of the conducting transistor $T_{22}$. According to FIG. 4D, the output signal $U'_I$ therefore jumps again to the low level fixed by the supply voltage $-U_S$.

The processes explained above are also repeated accordingly for the course of the voltage $U_D$ according to FIG. 4B from its maximum negative value to its maximum positive value. The current zero crossing detector 12 according to FIG. 10 therefore supplies the pulse-shaped output signal $U'_I$ according to FIG. 4D.

Figure 11:
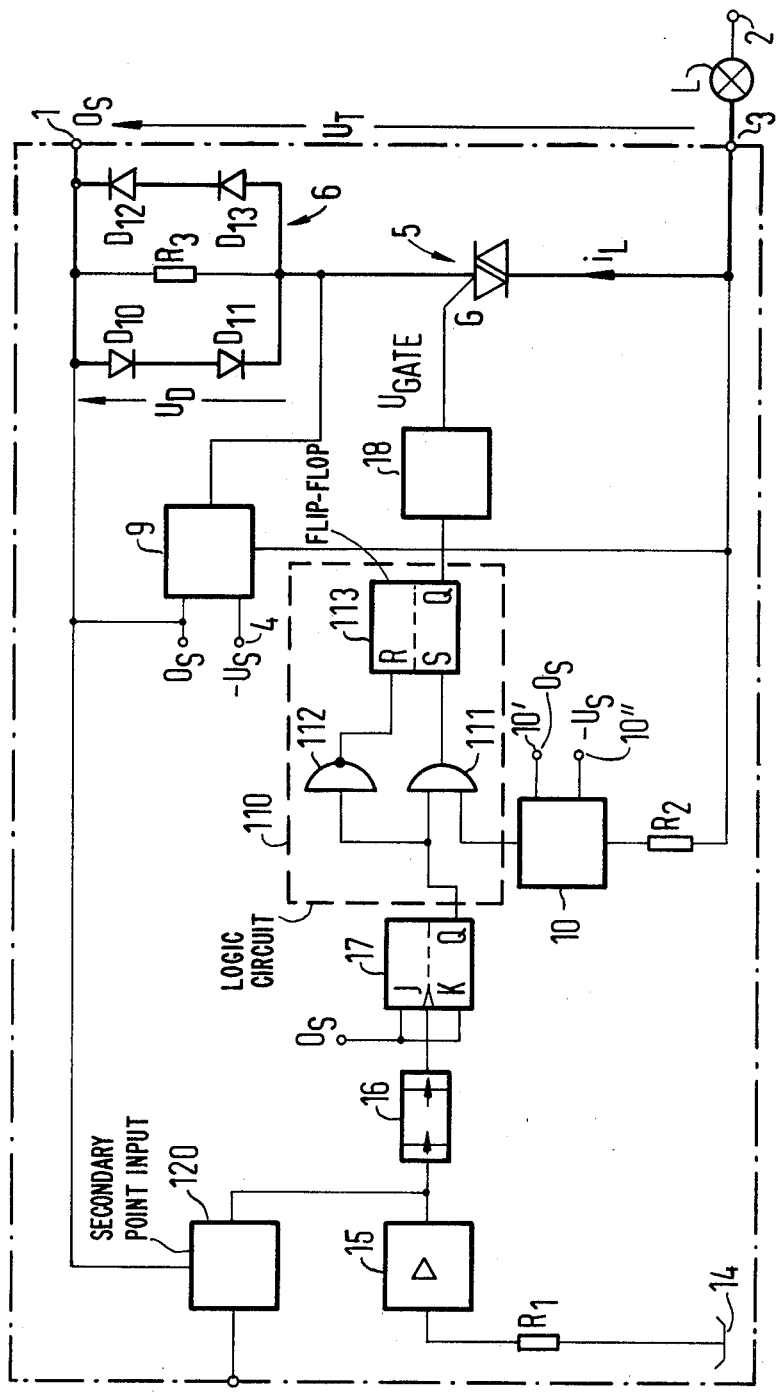
FIG. 11 is a schematic circuit diagram of another embodiment of an electronic sensor on/off switch according to the invention.

FIG. 11, in which like elements as in FIG. 1 are provided with the same reference symbols, shows a further embodiment of the sensor on/off switch according to the invention. With regard to the components already explained in connection with FIG. 1 of the sensor on/- off switch, reference is made to the explanations in connection with FIG. 1.

In the embodiment according to FIG. 11, the gate G of the triac 5 is addressed by a continuous signal $U_{GATE}$. For this purpose, a logic circuit 110 contains an AND gate 111, which is connected with one input thereof to the output of the already-explained voltage zero crossing detector 10 and with a further input to the already-explained flip-flop 17. The output of the flip-flop 17 is further coupled through an inverter 12 to a resetting input R of a flip-flop 113, while the output of the AND gate 111 is coupled to a setting input S of the flip-flop 113. An output Q of the flip-flop 113 is coupled through the already-explained output stage 18 to the gate G of the triac 5.

If the sensor 14 is actuated for switching-on, the flip-flop 17 is set and delivers an output signal at its output Q, whereby the AND gate 111 is made operative. At the next zero crossing of the voltage $U_T$ between the terminals 1 and 3, the voltage zero crossing detector 10 furnishes a pulse-shaped output signal in the manner explained in connection with FIGS. 1, 3 and 4. The output signal is transmitted through the AND gate 111 to the setting input S of the flip-flop 113, whereby this flip-flop is set. This switching state is maintained continuously until the sensor 14 is actuated again to switch off the load L. The flip-flop 17 is therefore reset, so that its output Q falls to a low level. This low level is inverted by the inverter 112, so that the flip-flop 113 is reset, i.e. the output Q of this flip-flop falls to a low level, so that the control signal $U_{GATE}$ at the gate G of the triac 5 vanishes, so that the triac is cut off and the load is switched off.

If it is desired the sensor on/off switch can be operated also from a different point (secondary point), a secondary point input 120 can be provided which is inserted into the overall circuit ahead of the time delay stage 16. The on/off switch can then also be switched on and off from another point via a sensor corresponding to the sensor 14.

I claim:

1. Electronic sensor on/off switch for a load connected to an a-c supply network, comprising a controlled semiconductor switch connected in series with the load, a sensor for switching the load on and off, a control circuit connected from said sensor to said switch, said switch being addressable by said control circuit in a conducting state with the load switched on by a signal holding said switch in the conducting state at the zero crossing of a current passing through the load, and in non-conducting state with the load disconnected by a signal switching said switch into the conducting state for switching on the load at the zero crossing of an output a-c voltage at said switch, a power supply circuit connected to said control circuit, a two-terminal voltage limiting network connected in a series circuit with said switch for generating an amplitude-limited a-c voltage if said switch is conducting, an inductive converter conducted to said two-terminal voltage limiting network, a terminal producing a reference potential point connected to said two-terminal voltage limiting network, a storage capacitor connected to said inductive converter for producing a supply voltage for said control circuit relative to the reference potential point, a branch connected to said series circuit of said two-terminal voltage limiting network and said switch including said storage capacitor and a rectifier, and another terminal connected between said storage capacitor and said rectifier for producing the supply voltage in the non-conducting state of said switch, said storage capacitor being charged by the output a-c voltage when said switch is in the non-conducting state.

2. Electronic sensor on/off switch according to claim 1, wherein said two-terminal voltage limiting network comprises an ohmic resistor and two rectifiers connected in parallel to said resistor and anti-parallel to each other.

3. Electronic sensor on/off switch according to claim 2, wherein each rectifier is in the form of at least one series-connected diode.

4. Electronic sensor on/off switch according to claim 1, wherein said inductive converter is in the form of a choke converter.

5. Electronic sensor on/off switch according to claim 4, wherein said choke converter comprises a pulse generator having a pulse repetition frequency being high relative to one-half the line frequency, a semiconductor switch controlled by said pulse generator, a choke coil connected in series with the control path of said semiconductor switch, said choke coil and control path of said semiconductor switch being shunted across said two-terminal voltage limiting network, and a rectifier diode having an anode connected to said supply voltage terminal and a cathode connected to said connection of said choke coil and the control path of said semiconductor switch.

6. Electronic sensor on/off switch according to claim 1, wherein said inductive converter comprises a power transformer and a rectifier connected to said power transformer.

7. Electronic sensor on/off switch according to claim 1, wherein said inductive converter is in the form of a flux converter.

8. Electronic sensor on/off switch according to claim 1, wherein said inductive converter is in the form of a blocking transformer.

9. Electronic sensor on/off switch according to claim 1, wherein said switch has a control electrode, said sensor is operable to produce an on-signal, and said control circuit comprises a voltage zero crossing detector for delivering a pulse-shaped output signal as a function of the zero crossings of the output a-c voltage if said switch is in the non-conducting state and the load is switched off, a logic circuit operable by receiving said on-signal from said sensor and said pulse-shaped output signal for feeding said pulse-shaped output signal to said control electrode, and a current zero crossing detector connected to said two-terminal voltage limiting network for transforming voltage at said two-terminal voltage limiting network into a pulse-shaped output signal, said voltage zero crossing detector being disconnected from said control electrode and the pulse-shaped output signal of said current zero crossing detector being connected to said control electrode by said logic circuit when said switch is in the conducting state.

10. Electronic sensor on/off switch according to claim 9, wherein said voltage zero crossing detector comprises a first transistor having an emitter connected to said output a-c voltage reference potential point terminal, a first working resistor connected from the collector of said first transistor to said supply voltage terminal, a voltage divider being connected to said supply voltage terminal and having a tap connected to the base of said first transistor, a second transistor having an emitter connected to said tap of said voltage divider, a collector connected to the collector of said first transistor, and a base connected to said output a-c voltage reference potential point terminal, a third transistor having an emitter connected to said output a-c voltage reference potential point terminal, a second working resistor connected from the collector of said third transistor to said supply voltage terminal, and a base of said third transistor connected to said collectors of said first and second transistors, and said first working resistor, said first and second transistors being switched into conduction at given negative and positive values in the region of the zero crossing of the output a-c voltage by said voltage divider, and an output connected to the collector of said third transistor and said second working resistor for producing the pulse-shaped output signal between the collector of said third transistor and the output a-c voltage reference potential point terminal.

11. Electronic sensor on/off switch according to claim 9, wherein said current zero crossing detector comprises a first transistor, at least one diode connected against flow direction of the base-emitter path of said first transistor from said base of said first transistor to said two-terminal voltage limiting network, a first resistor connected from the base of said first transistor to said supply voltage terminal, the emitter of said first transistor being connected to said reference potential point terminal, a second resistor connected from the collector of said first transistor to said supply voltage terminal, a second transistor having a base connected to the collector of said first transistor and an emitter connected to said reference potential point terminal, a second resistor connected from the base of said second transistor to said supply voltage terminal, a third transistor connected from the collector of said second transistor to said supply voltage terminal, a third transistor having an emitter connected to said reference potential point terminal and a collector connected to the collector of said second transistor and said third resistor, a fourth resistor connected from the base of said third transistor to said two-terminal voltage limiting network, a fourth transistor having a base connected to the collector of said third transistor and an emitter connected to said reference potential point terminal, a fifth resistor connected from the collector of said fourth transistor to said supply voltage terminal, and an output connected to the collector of said fourth transistor producing the pulse-shaped output signal between said output and said reference potential point terminal.

12. Electronic sensor on/off switch according to claim 9 or 11, including a monostable multivibrator connected between said current zero crossing detector and said logic circuit for adjusting a given pulse width of the pulse-shaped output signal.

13. Electronic sensor on/off switch according to claim 12, wherein said monostable multivibrator and said voltage zero crossing detector each include an output, and said logic circuit comprises a flip-flop having a setting input connected to said output of said monostable multivibrator, a resetting input and a complimentary output, an inverter connected from said resetting input to said output of said voltage zero crossing detector, a first AND gate having one input connected to said complimentary output of said flip-flop, and another input connected to said output of said voltage zero crossing detector, an OR gate having one input connected to an output of said first AND gate and another input connected to said output of said monostable multivibrator, and a second AND gate having one input connected to the output of said OR gate, another input connected to said sensor and an output connected to said control electrode of said switch.

14. Electronic sensor on/off switch according to claim 13, including a pre-amplifier connected to said sensor, a time delay stage connected to said pre-amplifier, a second flip-flop having a control input connected to said time delay stage and an output connected to said other input of said second AND gate.

15. Electronic sensor on/off switch according to claim 14, wherein said logic circuit further comprises another monostable multivibrator having an input connected to said output of said second flip-flop and an output, another OR gate having an input connected to said output of said other monostable multivibrator, another input connected to the output of said second AND gate, and an output connected to said control electrode.

16. Electronic sensor on/off switch according to claim 1, wherein said switch has a control electrode, said sensor is operable to produce an on-signal, and said control circuit comprises a voltage zero crossing detector for delivering a pulse-shaped output signal as a function of the zero crossing of the output a-c voltage if said switch is in the non-conducting state and the load is switched off, a logic circuit operable by receiving said on-signal from said sensor and said pulse-shaped output signal for feeding said pulse-shaped output signal to said control electrode, said logic circuit comprising an AND gate having an input connected to said voltage zero crossing detector, and another input connected to said sensor, an inverter having an input connected to said sensor and an output, a flip-flop having a setting input connected to the output of the AND gate, a resetting input connected to said output of said inverter, and an output being controlled by said setting input and connected to said control electrode.

* * * * *